US011799452B2

(12) United States Patent
Shih

(10) Patent No.: US 11,799,452 B2
(45) Date of Patent: Oct. 24, 2023

(54) WIRELESS SIGNAL EMITTER OF TIRE PRESSURE DETECTOR

(71) Applicant: MOBILETRON ELECTRONICS CO., LTD., Taichung (TW)

(72) Inventor: Jen-Yuan Shih, Taichung (TW)

(73) Assignee: MOBILETRON ELECTRONICS CO., LTD., Taichung (TW)

(*) Notice: Subject to any disclaimer, the term of this patent is extended or adjusted under 35 U.S.C. 154(b) by 183 days.

(21) Appl. No.: 17/393,914

(22) Filed: Aug. 4, 2021

(65) Prior Publication Data

US 2022/0060179 A1 Feb. 24, 2022

(30) Foreign Application Priority Data

Aug. 18, 2020 (TW) ................................. 109128032

(51) Int. Cl.
*H03H 11/28* (2006.01)
*B60C 23/04* (2006.01)

(52) U.S. Cl.
CPC ......... *H03H 11/28* (2013.01); *B60C 23/0438* (2013.01)

(58) Field of Classification Search
None
See application file for complete search history.

(56) References Cited

U.S. PATENT DOCUMENTS 10,088,379 B2  10/2018  Yu et al.
10,647,171 B2  5/2020  Chiu et al.

2008/0200134 A1* 8/2008 Jongsma ............. H04B 1/0458
455/127.1
(Continued)

FOREIGN PATENT DOCUMENTS

CN    2806205 Y     8/2006
EP    1545013 A1    6/2005
TW    M483884 U     8/2014

(Continued)

OTHER PUBLICATIONS

Search report for TW109128032, dated Apr. 1, 2022, Total of 2 pages.

(Continued)

*Primary Examiner* — Anh Q Tran
(74) *Attorney, Agent, or Firm* — Apex Juris, pllc; Hilde Coeckx

(57) ABSTRACT

A wireless signal emitter of a tire pressure detector includes a controller, an antenna, and an impedance matching module. The impedance matching module includes an impedance matching circuit and an impedance adjusting circuit. The impedance matching circuit is electrically connected to the controller. The impedance adjusting circuit is electrically connected to the antenna and the impedance matching circuit. The impedance adjusting circuit includes a switching element electrically connected to the controller. When the switching element receives different signals of the controller, the impedance adjusting circuit switches between two different configurations, so that the impedance matching module has two different impedances, thereby the antenna sends two different radio frequency signals to achieve a purpose of a single tire pressure detector suitable for in-car receivers of different frequencies.

7 Claims, 5 Drawing Sheets

(56) References Cited

U.S. PATENT DOCUMENTS

2014/0306815 A1* 10/2014 Henriet .............. B60C 23/0479
340/447
2021/0067195 A1* 3/2021 Yu .......................... H04B 1/715

FOREIGN PATENT DOCUMENTS

| TW | I514675 B | 12/2015 |
| TW | I625043 B | 5/2018 |
| TW | I680643 B | 12/2019 |
| TW | I701165 | 8/2020 |

OTHER PUBLICATIONS

English abstract for CN2806205, Total of 1 page.
English abstract for TWI514675, Total of 1 page.
English abstract for TWI625043, Total of 1 page.
English abstract for TWI680643, Total of 1 page.
English abstract for TWI701165, Total of 1 page.
English Abstract of US2015224830 (A1), corresponding to TWM483884 (U), Total of 1 page.

* cited by examiner

WIRELESS SIGNAL EMITTER OF TIRE PRESSURE DETECTOR

BACKGROUND OF THE INVENTION

Technical Field

The present invention relates generally to a tire pressure detector, and more particularly to a wireless signal emitter of a tire pressure detector.

Description of Related Art

The tire pressure monitoring system (Tire Pressure Monitoring System, TPMS) is a system that can report the tire condition information of each tire in real-time, wherein the system is mainly equipped with tire pressure detectors on the rims of each tire of a vehicle for detecting tire pressure, tire temperature and other tire condition information of each tire, which helps to ensure the driving safety of drivers and prevent accidents such as tire blowouts and wheel falling. As such, the tire pressure monitoring system is one of the standard equipment for vehicle safety in modern advanced countries.

However, the RF signal frequencies that can be received by the in-car receiving devices of various automobile brands are different. Generally speaking, common RF signal frequencies are 315 MHz and 433 MHz. Even the in-car receivers of the same car brand will use different RF signal frequencies depending on the car model or outgoing time. In order to cope with the existing in-car receivers on the market, car repair factories and dealers must also stock 315M Hz and 433M Hz tire pressure detectors, so there is a huge stocking cost.

In all aspects, how to send different RF signal frequencies to the in-car receiving device by merely single one tire pressure detector, and make the tire pressure detector suitable for in-car receiving devices of multiple car brands has become a major issue in the industry.

BRIEF SUMMARY OF THE INVENTION

In view of the above, the primary objective of the present invention is to provide a wireless signal emitter of a tire pressure detector, which could send a wireless signal with one of two frequencies.

The present invention provides a wireless signal emitter of a tire pressure detector, including a controller, an antenna, and an impedance matching module, wherein the controller has a first output port and a second output port. The first output port is adapted to output either a first radio frequency signal or a second radio frequency signal, wherein the first radio frequency signal has a first frequency, and the second radio frequency signal has a second frequency. The second output port is adapted to output either a first control signal corresponding to the first radio frequency signal or a second control signal corresponding to the second radio frequency signal. The impedance matching module includes an impedance matching circuit and an impedance adjusting circuit, wherein the impedance matching circuit is electrically connected between the first output port and the antenna. The impedance adjusting circuit is electrically connected to the antenna and the impedance matching circuit and includes a switching element electrically connected to the second output port. When the switching element receives the first control signal, the impedance adjusting circuit switches to a first configuration, while when the switching element receives the second control signal, the impedance adjusting circuit switches to a second configuration, wherein when the impedance adjusting circuit is in the first configuration, the impedance matching module has a first impedance, making the antenna send the first radio frequency signal, while when the impedance adjusting circuit is in the second configuration, the impedance matching module has a second impedance, making the antenna send the second radio frequency signal.

With the aforementioned design, with the impedance matching device in the wireless signal emitter of the tire pressure detector, the radio frequency signal output by the controller is different from the control signal, resulting in different impedances, so that the antenna sends the radio frequency signals of different frequencies to the in-car receivers, thereby achieving a purpose of a single tire pressure detector suitable for in-car receivers of multiple automobile manufacturers.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
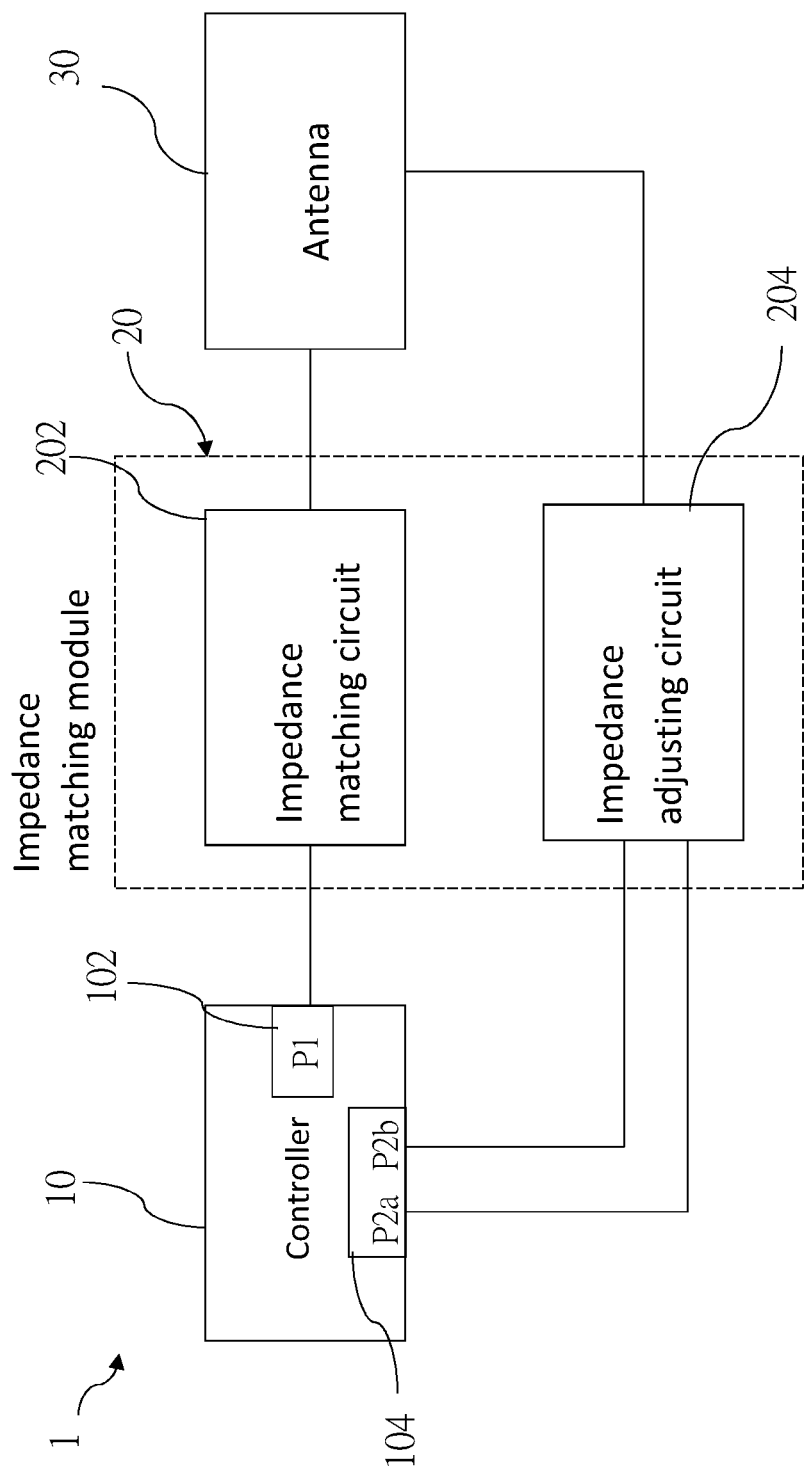
FIG. 1 is a block diagram of the wireless signal emitter of the tire pressure detector according to a first embodiment of the present invention.
Figure 2:
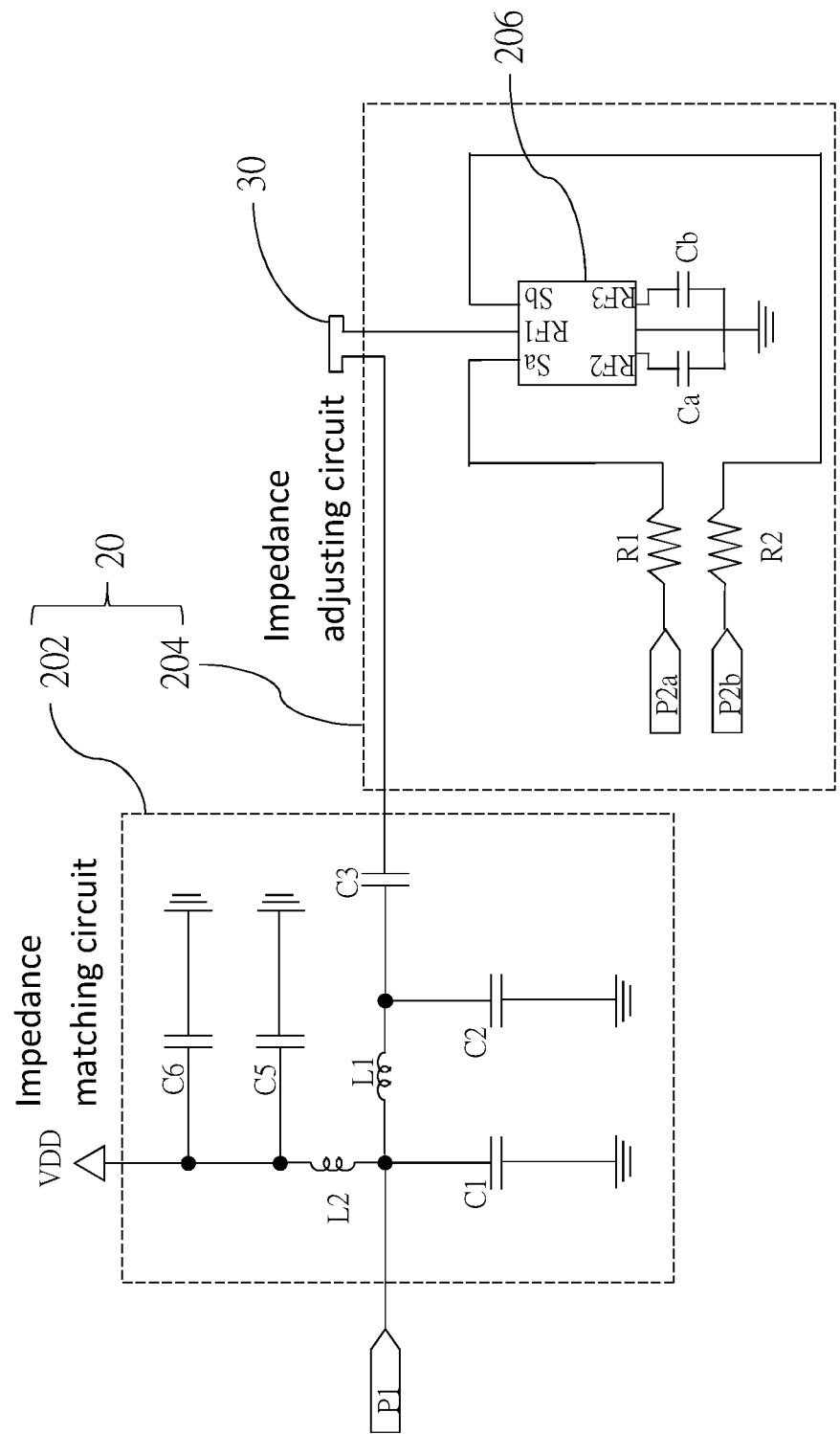
FIG. 2 is a block diagram, showing the impedance matching module and the antenna according to the first embodiment of the present invention.

A wireless signal emitter 1 of a tire pressure detector according to a first embodiment of the present invention is illustrated in FIG. 1 and FIG. 2 and includes a controller 10, an impedance matching module 20, and an antenna 30.

In the current embodiment, the controller 10 is a microcontroller and has a first output port 102 and a second output port 104, wherein the first output port 102 has a pin P1 adapted to output either a first radio frequency signal or a second radio frequency signal. The first radio frequency signal has a first frequency, and the second radio frequency signal has a second frequency. In the current embodiment, the first frequency is 315 MHz as an example, and the second frequency is 433 MHz as an example. The second output port 104 is adapted to correspondingly output either a first control signal or a second control signal. In the current embodiment, the second output port 104 has two pins P2a, P2b. When the first output port 102 outputs the first radio frequency signal, the controller 10 correspondingly outputs the first control signal through the two pins P2a, P2b, wherein when the two pins P2a, P2b output the first control signal, one of the two pins (i.e., the pin P2a) is low voltage, and the other of the two pins (i.e., the pin P2b is high voltage). When the first output port 102 outputs the second radio frequency signal, the controller 10 correspondingly outputs the second control signal through the two pins P2a, P2b, wherein when the two pins P2a, P2b output the second control signal, one of the two pins (i.e., the pin P2a) is high voltage, and the other of the two pins (i.e., the pin P2b is low voltage.

The impedance matching module 20 is electrically connected between the antenna 30 and the first output port 102 of the controller 10. The impedance matching module 20 includes an impedance matching circuit 202 and an impedance adjusting circuit 204, wherein the impedance matching circuit 202 is electrically connected between the first output port 102 and the antenna 30, and the impedance adjusting circuit 204 is electrically connected between the antenna 30 and the impedance matching circuit 202.

Referring to FIG. 2, in the current embodiment, the impedance matching circuit 202 includes a matching loop and a power source loop, wherein a plurality of capacitors C1-C3 and an inductor L1 form the matching loop, and another inductor L2 and two capacitors C5, C6 form the power source loop and are connected to a power source VDD. The impedance adjusting circuit 204 includes a switching element which is an RF switch 206 as an example, wherein the RF switch 206 is electrically connected to the second output port 104. When the RF switch 206 receives the first control signal, the impedance adjusting circuit 204 switches to a first configuration, while when the RF switch 206 receives the second control signal, the impedance adjusting circuit 204 switches to a second configuration, wherein when the impedance adjusting circuit 204 is in the first configuration, the impedance matching module 20 has a first impedance, while when the impedance adjusting circuit 204 is in the second configuration, the impedance matching module 20 has a second impedance.

More specifically, the RF switch 206 has a first connecting end RF1, a second connecting end RF2, a third connecting end RF3, and two selecting ends Sa, Sb, wherein the first connecting end RF1 is electrically connected between the antenna 30 and one of the capacitors C1-C3 (i.e., the capacitor C3) of the matching loop of the impedance matching circuit 202. The impedance adjusting circuit 204 further includes a first impedance adjusting loop and a second impedance adjusting loop respectively and electrically connected to the second connecting end RF2 and the third connecting end RF3 of the RF switch 206, wherein the first impedance adjusting loop has at least one first impedance element which is a first capacitor Ca as an example; an end of the first capacitor Ca is electrically connected to the second connecting end RF2, and another end thereof is connected to ground; the second impedance adjusting loop has at least one second impedance element which is a second capacitor Cb as an example; an end of the second capacitor Cb is electrically connected to the third connecting end RF3, and another end thereof is connected to ground. The two selecting ends Sa, Sb are respectively and electrically connected to the two pins P2a, P2b of the second output port 104 through two resistors R1, R2. The RF switch 206 establishes a conduction between the first connecting end RF1 and the second connecting end RF2 or a conduction between the first connecting end RF1 and the third connecting end RF3 depending on different potentials of the two selecting ends Sa, Sb.

When the two selecting ends Sa, Sb of the RF switch 206 receive the first control signal, a conduction between the first connecting end RF1 and the second connecting end RF2 is established, and a conduction between the first connecting end RF1 and the third connecting end RF3 is cut off, wherein the first capacitor Ca is connected between the antenna 30 and ground to form the first configuration. At this time, the first impedance is a common impedance of both of the impedance matching circuit 202 and the impedance adjusting circuit 204; the antenna 30 and the impedance matching module 20 generate a resonance, and a resonant frequency of the resonance is the first frequency (315 MHz), thereby the antenna 30 sends a wireless signal of the first radio frequency signal.

When the two selecting ends Sa, Sb of the RF switch 206 receive the second control signal, a conduction between the first connecting end RF1 and the third connecting end RF3 is established, and a conduction between the first connecting end RF1 and the second connecting end RF2 is cut off, wherein the second capacitor Cb is connected between the antenna 30 and ground to form the second configuration. At this time, the second impedance is a common impedance of both of the impedance matching circuit 202 and the impedance adjusting circuit 204; the antenna 30 and the impedance matching module 20 generate a resonance, and a resonant frequency of the resonance is the second frequency (433 MHz), thereby the antenna 30 sends a wireless signal of the second radio frequency signal.

In the current embodiment, the controller 10 could be connected to a detecting assembly (not shown), wherein the detecting assembly is adapted to detect at least one tire pressure, and the controller 10 converts a detecting result of the detecting assembly into either the first radio frequency signal or the second radio frequency signal to be sent as a wireless signal through the impedance matching module 20 and the antenna 30, thereby achieving a purpose of a single tire pressure detector suitable for in-car receivers of different frequencies.

Figure 3:
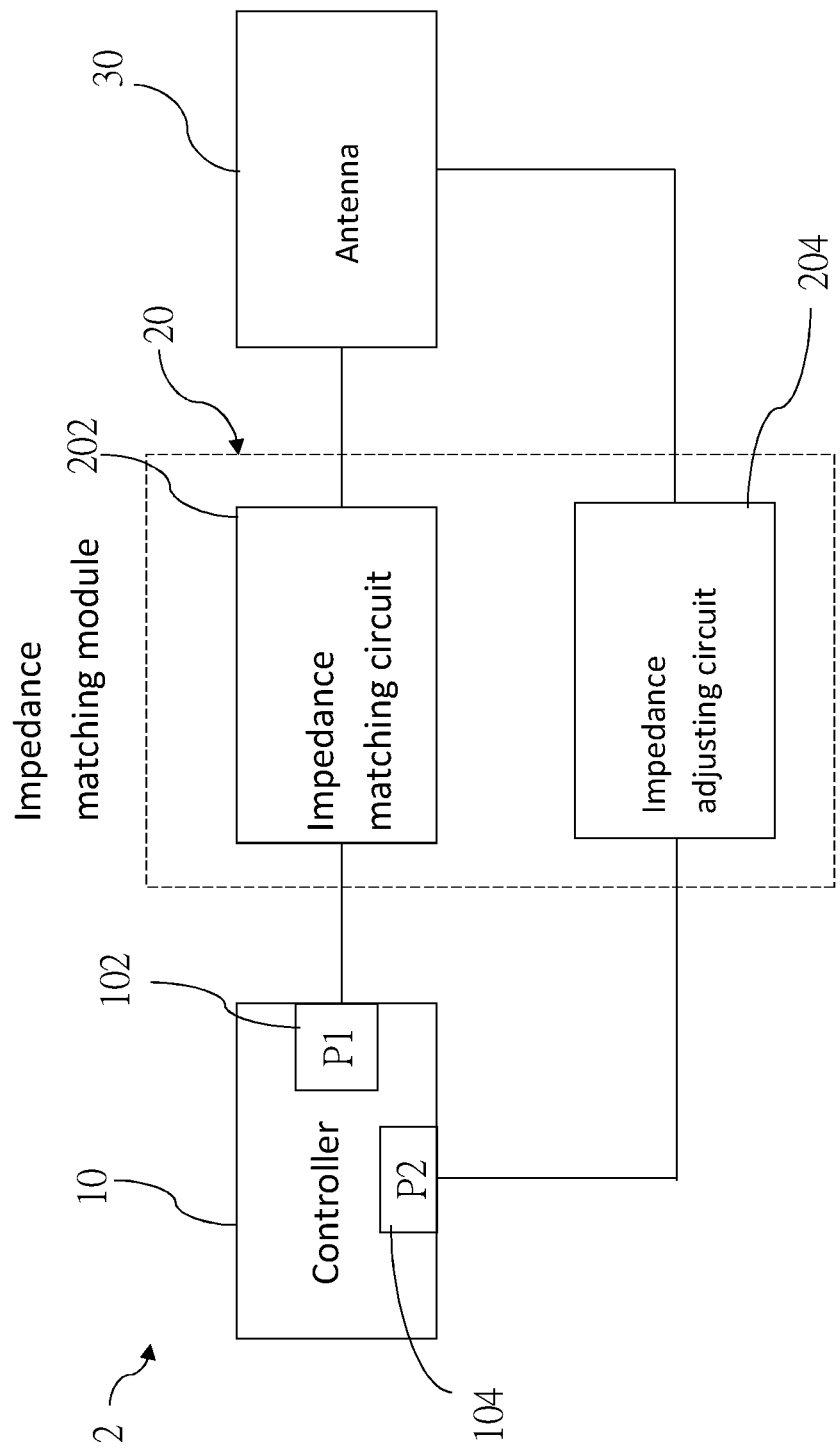
FIG. 3 is a block diagram of the wireless signal emitter of the tire pressure detector according to a second embodiment of the present invention.
Figure 4:
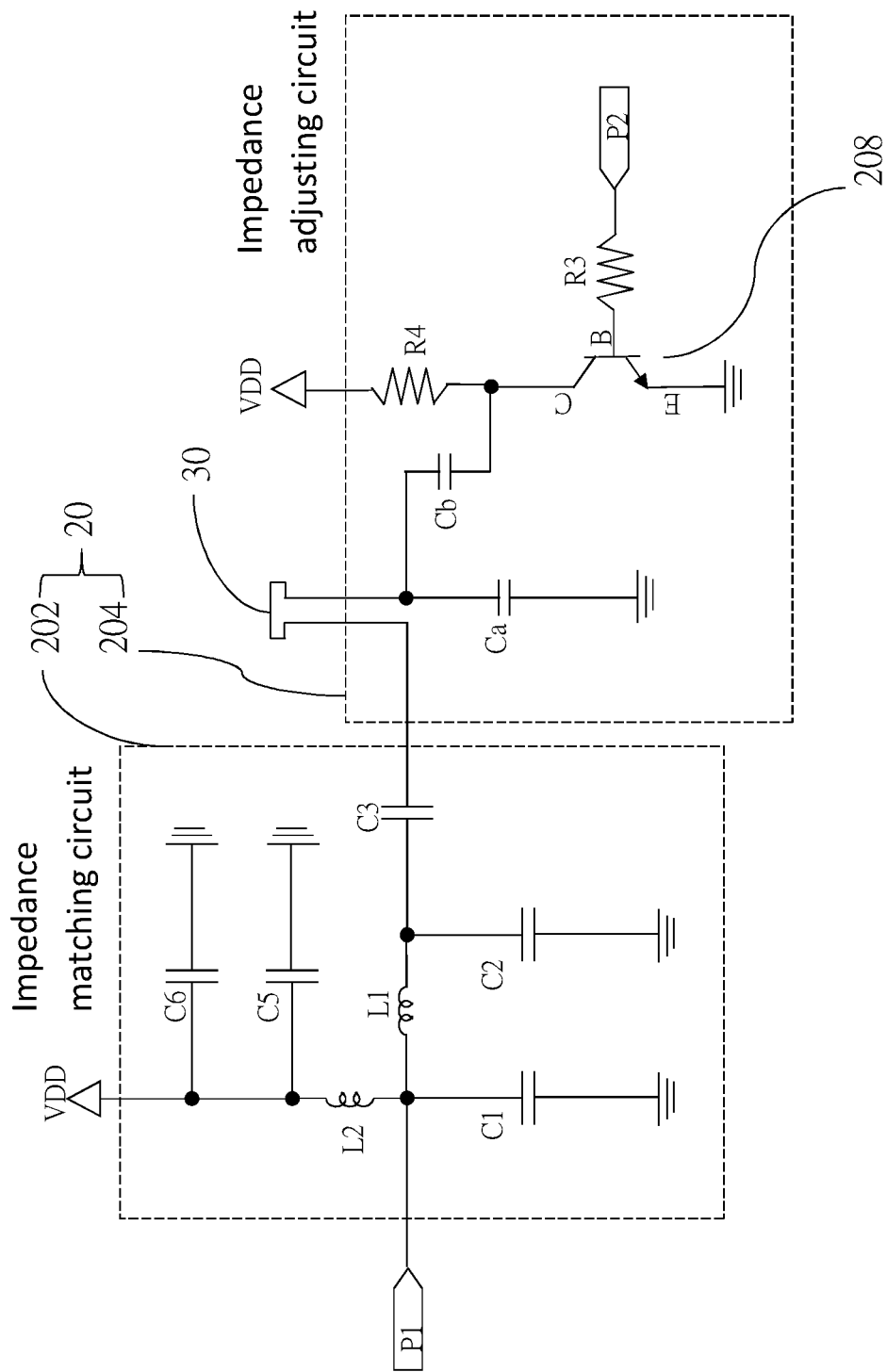
FIG. 4 is a block diagram, showing the impedance matching module and the antenna according to the second embodiment of the present invention.

A wireless signal emitter 2 of a tire pressure detector according to a second embodiment of the present invention is illustrated in FIG. 3 and FIG. 4, which has almost the same structure as that of the first embodiment, except that the second output port 104 of the controller 10 of the current embodiment has a pin P2. In addition, the switching element of the impedance adjusting circuit 204 is a bipolar junction transistor 208. When the first output port 102 outputs the first radio frequency signal, the pin P2 of the second output port 104 of the controller 10 correspondingly outputs the first control signal, wherein when the pin P2 outputs the first control signal, the pin P2 is high voltage as an example. When the first output port 102 outputs the second radio frequency signal, the pin P2 of the second output port 104 of the controller 10 correspondingly outputs the second control signal, wherein when the pin P2 outputs the second control signal, the pin P2 is low voltage as an example.

In the current embodiment, the impedance adjusting circuit 204 includes a switching element which is a bipolar junction transistor 208 as an example, wherein the bipolar junction transistor 208 is electrically connected to the second output port 104 of the controller 10. When the bipolar junction transistor 208 receives the first control signal, the impedance adjusting circuit 204 switches to a first configuration, while when the bipolar junction transistor 208 receives the second control signal, the impedance adjusting circuit 204 switches to a second configuration, wherein when the impedance adjusting circuit 204 is in the first configuration, the impedance matching module 20 has a first impedance, while when the impedance adjusting circuit 204 is in the second configuration, the impedance matching module 20 has a second impedance.

The impedance adjusting circuit 204 has a first impedance adjusting loop and a second impedance adjusting loop which are connected in parallel, wherein the first impedance adjusting loop includes at least one first impedance element which is a first capacitor Ca as an example; an end of the first capacitor Ca is electrically connected to the antenna 30 and the capacitor C3 of the impedance matching loop of the impedance matching circuit 202, and another end thereof is connected to ground. The second impedance adjusting loop includes at least one second impedance element which is a second capacitor Cb as an example, wherein an end of the second capacitor Cb is electrically connected to the antenna 30, and another end thereof is connected to a collector end C of the bipolar junction transistor 208; the collector end C is connected to a power source VDD via a resistors R4; a base end B of the bipolar junction transistor 208 is electrically connected to the pin P2 of the second output port 104 of the controller 10 via a resistor R3; an emitter end E of the bipolar junction transistor 208 is connected to ground.

More specifically, when the bipolar junction transistor 208 receives the first control signal, the bipolar junction transistor 208 switches to a conducting state, wherein the first capacitor Ca and the second capacitor Cb are connected in parallel to form the first configuration. At this time, the first impedance is a common impedance of both of the impedance matching circuit 202 and the impedance adjusting circuit 204; the antenna 30 and the impedance matching module 20 generate a resonance, and a resonant frequency of the resonance is the first frequency (315 MHz), thereby the antenna 30 sends a wireless signal of the first radio frequency signal.

When the bipolar junction transistor 208 receives the second control signal, the bipolar junction transistor 208 switches to a cut-off state, wherein the first capacitor Ca and the second capacitor Cb are not connected in parallel, thereby forming the second configuration. At this time, the second impedance is a common impedance of both of the first capacitor Ca of the impedance matching circuit 202 and the impedance adjusting circuit 204; the antenna 30 and the impedance matching module 20 generate a resonance, and a resonant frequency of the resonance is the second frequency (433 MHz), thereby the antenna 30 sends a wireless signal of the second radio frequency signal.

Figure 5:
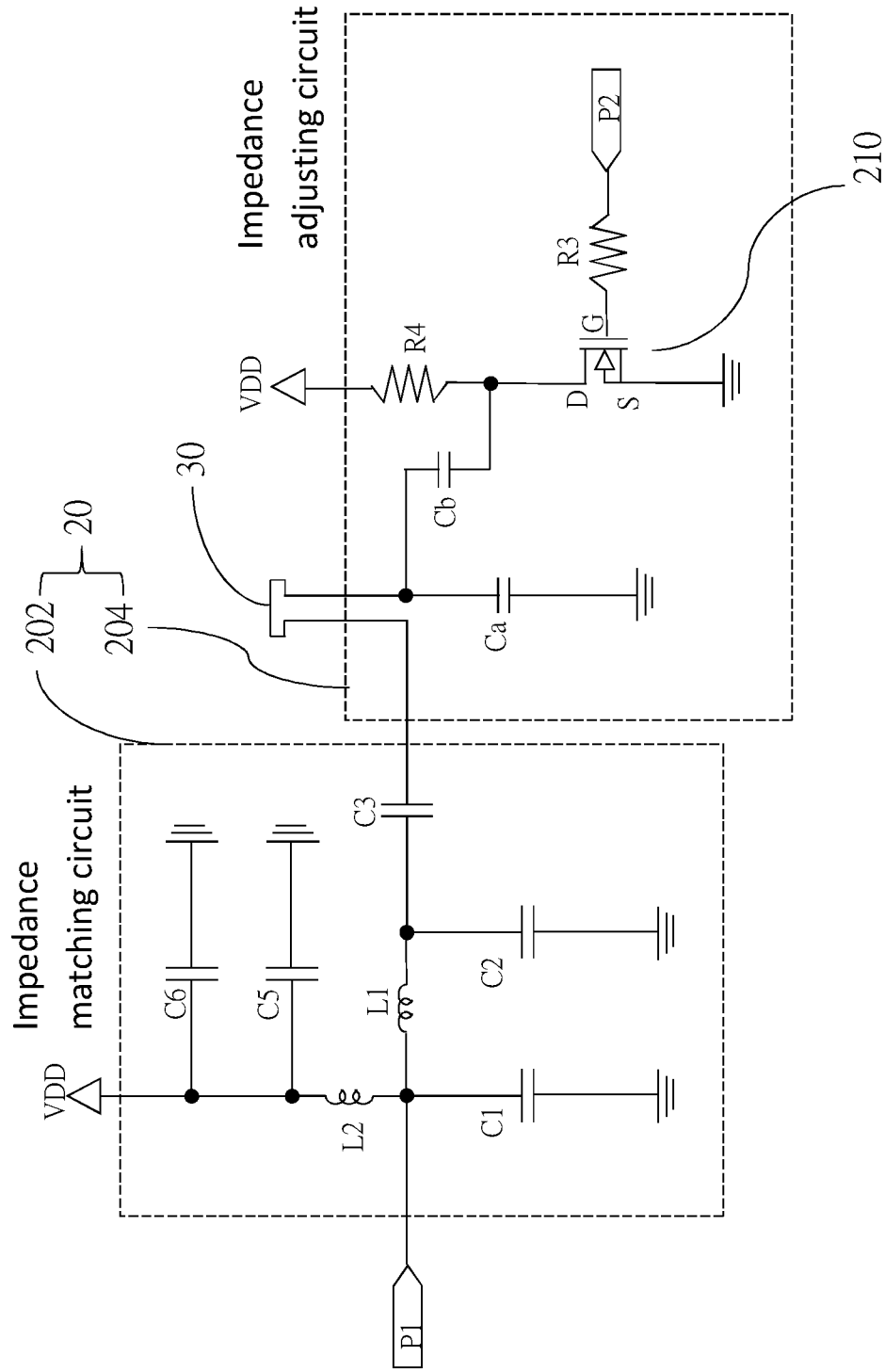
FIG. 5 is a block diagram, showing the impedance matching module and the antenna according to a third embodiment of the present invention.

The impedance matching module 20 and the antenna 30 of a wireless signal emitter of a tire pressure detector according to a third embodiment of the present invention are illustrated in FIG. 5, wherein the difference between the third embodiment and the second embodiment is that the switching element of the impedance adjusting circuit 204 is a metal oxide semiconductor field effect transistor 210 (MOSFET); an end of the second capacitor Cb of the impedance adjusting circuit 204 is electrically connected to the antenna 30, and another end thereof is connected to a drain end D of the MOSFET 210; the drain end D and a resistors R4 are connected in series to be connected to the power source VDD; a gate end G of the MOSFET 210 and a resistors R3 are connected in series to be electrically connected to the pin P2 of the second output port 104 of the controller 10; a source end S of the MOSFET 210 is connected to ground. Other components and electrical connecting structures of the current embodiment are the same as that of the second embodiment, thus we are not going to describe in detail herein.

The second embodiment and the third embodiment are similar to the first embodiment, the controller 10 could be connected to the detecting assembly, thereby achieving a purpose of a single tire pressure detector suitable for in-car receivers of different frequencies through signal conversion and matching. In the aforementioned embodiments, the at least one first impedance element and the at least one second impedance element could include a plurality of first impedance elements and a plurality of second impedance elements.

It must be pointed out that the embodiments described above are only some preferred embodiments of the present invention. All equivalent structures which employ the concepts disclosed in this specification and the appended claims should fall within the scope of the present invention.

What is claimed is:

1. A wireless signal emitter of a tire pressure detector, comprising:

a controller having a first output port and a second output port, wherein the first output port is adapted to output either a first radio frequency signal or a second radio frequency signal; the first radio frequency signal has a first frequency, and the second radio frequency signal has a second frequency; the second output port is adapted to output either a first control signal corresponding to the first radio frequency signal or a second control signal corresponding to the second radio frequency signal;

an antenna; and an impedance matching module comprising an impedance matching circuit and an impedance adjusting circuit, wherein the impedance matching circuit is electrically connected between the first output port and the antenna; the impedance adjusting circuit is electrically connected between the antenna and the impedance matching circuit and comprises a switching element electrically connected to the second output port; when the switching element receives the first control signal, the impedance adjusting circuit switches to a first configuration, while when the switching element receives the second control signal, the impedance adjusting circuit switches to a second configuration, wherein when the impedance adjusting circuit is in the first configuration, the impedance matching module has a first impedance, making the antenna send the first radio frequency signal, while when the impedance adjusting circuit is in the second configuration, the impedance matching module has a second impedance, making the antenna send the second radio frequency signal; and wherein the switching element of the impedance adjusting circuit is an RF switch; the impedance adjusting circuit comprises a first impedance adjusting loop and a second impedance adjusting loop which are electrically connected to the RF switch; when the RF switch receives the first control signal, the first impedance adjusting loop is electrically connected to the antenna and the impedance matching circuit to form the first configuration; when the RF switch receives the second control signal, the second impedance adjusting loop is electrically connected to the antenna and the impedance matching circuit to form the second configuration.

2. The wireless signal emitter as claimed in claim 1, wherein the RF switch has a first connecting end, a second connecting end, and a third connecting end; the first impedance adjusting loop comprises at least one first impedance element, and the second impedance adjusting loop comprises at least one second impedance element; the at least one first impedance element and the at least one second impedance element are respectively and electrically connected to the second connecting end and the third connecting end; when the RF switch receives the first control signal, a conduction between the first connecting end and the second connecting end is built, and a conduction between the first connecting end and the third connecting end is cut off, thereby forming the first configuration; when the RF switch receives the second control signal, the conduction between the first connecting end and the third connecting end is built, and the conduction between the first connecting end and the second connecting end is cut off, thereby forming the second configuration.

3. The wireless signal emitter as claimed in claim 2, wherein the at least one first impedance element is at least one first capacitor, and the at least one second impedance element is at least one second capacitor.

4. A wireless signal emitter of a tire pressure detector, comprising:
   a controller having a first output port and a second output port, wherein the first output port is adapted to output either a first radio frequency signal or a second radio frequency signal; the first radio frequency signal has a first frequency, and the second radio frequency signal has a second frequency; the second output port is adapted to output either a first control signal corresponding to the first radio frequency signal or a second control signal corresponding to the second radio frequency signal;
   an antenna; and
   an impedance matching module comprising an impedance matching circuit and an impedance adjusting circuit, wherein the impedance matching circuit is electrically connected between the first output port and the antenna; the impedance adjusting circuit is electrically connected between the antenna and the impedance matching circuit and comprises a switching element electrically connected to the second output port; when the switching element receives the first control signal, the impedance adjusting circuit switches to a first configuration, while when the switching element receives the second control signal, the impedance adjusting circuit switches to a second configuration, wherein when the impedance adjusting circuit is in the first configuration, the impedance matching module has a first impedance, making the antenna send the first radio frequency signal, while when the impedance adjusting circuit is in the second configuration, the impedance matching module has a second impedance, making the antenna send the second radio frequency signal; and
   wherein the switching element of the impedance adjusting circuit is a bipolar junction transistor; the impedance adjusting circuit comprises a first impedance adjusting loop and a second impedance adjusting loop; the first impedance adjusting loop is electrically connected to the antenna and the impedance matching circuit and comprises at least one first impedance element; the second impedance adjusting loop and the first impedance adjusting loop are connected in parallel, and comprises at least one second impedance element; the bipolar junction transistor is disposed on the second impedance adjusting loop and is connected to the at least one second impedance element in series; when the bipolar junction transistor receives the first control signal, the bipolar junction transistor switches to a conducting state; the at least one first impedance element and the at least one second impedance element are connected in parallel to form the first configuration; when the bipolar junction transistor receives the second control signal, the bipolar junction transistor switches to a cut-off state; the at least one first impedance element and the at least one second impedance element are not connected in parallel, thereby forming the second configuration.

5. The wireless signal emitter as claimed in claim 4, wherein when the at least one first impedance element is at least one first capacitor, and the at least one second impedance element is at least one second capacitor.

6. A wireless signal emitter of a tire pressure detector, comprising:
   a controller having a first output port and a second output port, wherein the first output port is adapted to output either a first radio frequency signal or a second radio frequency signal; the first radio frequency signal has a first frequency, and the second radio frequency signal has a second frequency; the second output port is adapted to output either a first control signal corresponding to the first radio frequency signal or a second control signal corresponding to the second radio frequency signal;
   an antenna; and
   an impedance matching module comprising an impedance matching circuit and an impedance adjusting circuit, wherein the impedance matching circuit is electrically connected between the first output port and the antenna; the impedance adjusting circuit is electrically connected between the antenna and the impedance matching circuit and comprises a switching element electrically connected to the second output port; when the switching element receives the first control signal, the impedance adjusting circuit switches to a first configuration, while when the switching element receives the second control signal, the impedance adjusting circuit switches to a second configuration, wherein when the impedance adjusting circuit is in the first configuration, the impedance matching module has a first impedance, making the antenna send the first radio frequency signal, while when the impedance adjusting circuit is in the second configuration, the impedance matching module has a second impedance, making the antenna send the second radio frequency signal; and
   wherein the switching element of the impedance adjusting circuit is a metal oxide semiconductor field effect transistor; the impedance adjusting circuit comprises a first impedance adjusting loop and a second impedance adjusting loop; the first impedance adjusting loop is electrically connected to the antenna and the impedance matching circuit and comprises at least one first impedance element; the second impedance adjusting loop and the first impedance adjusting loop are connected in parallel; the second impedance adjusting loop comprises at least one second impedance element; the metal oxide semiconductor field effect transistor is disposed on the second impedance adjusting loop and is connected to the at least one second impedance element in series; when the metal oxide semiconductor field effect transistor receives the first control signal, the metal oxide semiconductor field effect transistor switches to a conducting state; the at least one first impedance element and the at least one second impedance element are connected in parallel to form the first configuration; when the metal oxide semiconductor field effect transistor receives the second control signal, the metal oxide semiconductor field effect transistor switches to a cut-off state; the at least one first impedance element and the at least one second impedance element are not connected in parallel, thereby forming the second configuration.

7. The wireless signal emitter as claimed in claim 6, wherein the at least one first impedance element is at least one first capacitor, and the at least one second impedance element is at least one second capacitor.

* * * * *